EPITAXIAL GROWTH FROM SOLUTION WITH AMPHOTERIC DOPANT

Original Filed July 15, 1966

INVENTORS
HANS S. RUPPRECHT
JERRY M. WOODALL

BY John E. Dougherty Jr.
ATTORNEY

United States Patent Office 3,600,240
Patented Aug. 17, 1971

3,600,240
EPITAXIAL GROWTH FROM SOLUTION WITH AMPHOTERIC DOPANT

Hans S. Rupprecht, Yorktown Heights, and Jerry M. Woodall, Putnam Valley, N.Y., assignors to International Business Machines Corporation, Armonk, N.Y.

Original application July 15, 1966, Ser. No. 565,440. Divided and this application Dec. 12, 1968, Ser. No. 798,537
Int. Cl. H01l 7/38
U.S. Cl. 148—171 13 Claims

ABSTRACT OF THE DISCLOSURE

P-type gallium arsenide is grown epitaxially from solution in gallium on the surface of N-type gallium arsenide, with silicon as dopant on both sides of the junction. A recombination radiation device is made by the method.

This application is a division of co-pending application Ser. No. 565,440, filed July 15, 1966, now abandoned.

The present invention relates to an improved method of making semiconductor devices which emit radiation produced in the devices by electron hole recombination and more specifically to improved devices of this type which exhibit high external quantum efficiency.

There has been in recent years a continuing and increasing emphasis in both research and development on devices which emit light. Light emitting devices of this type have been fabricated using semiconductor bodies in which the light output is produced by recombination radiation. More specifically, this radiation is produced in an active or light emitting region in a semconductor crystal by causng electrons in the conduction band in the region to recombine with holes in either the valence band or in an impurity level near the valence band. In one form of such devices a P-N junction is employed as a means for injecting electrons into the light emitting region, which is usually a P type region. Devices of this type have also been fabricated using avalanche breakdown as the mechanism for producing the hole electron pairs necessary for the recombination process. Devices of both these type have been operated as lasers to produce outputs which are highly monochromatic, directional and coherent, and also as electroluminescent devices in which the light output does not have these characteristics. It is to electroluminescent devices of this latter type to which this invention principally relates and more specifically to electroluminescent devices which can produce light outputs with a high external quantum efficiency and which do not necessarily require avalanching and the high fields and voltage necessary for this process. Though the principal application of the invention, as stated above, is in electroluminescent devices, the inventive principles may also have application to semiconductor lasers.

The devices disclosed herein as illustrative embodiments of the invention include an active light emitting region which is wider than those of prior art devices. For example, in gallium arsenide electroluminescent devices of the prior art the recombination radiation is produced in a P type region which is heavily doped, usually with zinc, and the radiation is usually confined to a small portion of the material only a few microns thick immediately adjacent to the P-N junction. The heavily doped P material has been found to be highly absorbing of the recombination radiation thereby limiting severely the amount of output radiation which is realized. In the device of the present invention the active region is a wide compensated region, having a width, for example in excess of 30 microns, and is only slightly P type. Since there are only a relatively small concentration of acceptor sites available for recombination in this region, injected electrons diffuse and recombine throughout a large volume of the active region. The active region is so prepared that the majority of excess acceptors in the region are located above the valence band for the semiconductor material. The recombination transitions take place from the conduction band to this impurity band and are at an energy less than band gap thereby minimizing the possibility of absorption by band to band transitions. Since the active region is only slightly P type, with few if any free carriers in the valence band, there is little free carrier absorption in the valence band. As a result of this design, which provides a wide active region in which injected electrons recombine to produce radiation at a high efficiency which is not heavily absorbed within the device, a high external quantum efficiency is realized.

Devices having these characteristics have been built using a forward biased P–N junction as the means for injecting the electrons into the active region, and further using an amphoteric dopant which enters the crystalline lattice of the semiconductor substrate predominantly as an N type impurity on one side of the junction and as a P type impurity on the other side of the junction, Further, the devices of the invention have been fabricated employing a novel and improved solution regrowth method in which the temperature at which the regrowth takes place is controlled to cause the atoms of the amphoteric dopant to enter the recrystallized structure as the proper type of impurity to achieve the wide light emitting region having the characteristics described above.

The specfic embodiment disclosed herein as illustrating the inventive principles as a gallium arsenide electroluminescent diode having a P-N junction between an N region and a compensated Po region which is only silghtly P type. Silicon is the amphoteric dopant used in both the Po and N type regions. In the novel solution regrowth method of preparing these devices a gallium arsenide substrate crystal doped with N type silicon is brought into contact at an elevated temperature with a melt mixture which contains gallium arsenide, silicon and excess gallium. The temperature is such that as the melt is cooled the initial layers of the recrystallized region include the silicon impurity predominantly as an N type impurity. Thereafter cooling is carried out in a temperature range to produce the active region which is compensated in that the majority of the silicon atoms which enters as P type impurities are compensated by silicon atoms which enter as N type impurities, and the region contains only a relatively small excess of P type silicon impurity atoms. In one embodiment of the invention described herein a heavily doped P type layer is formed on the end of the Po active region and in another embodiment an ohmic contact is formed directly to the Po region. The outputs realized from these devices are in the infrared having wavelengths of about 9200 Angstroms when operated at room temperature.

An object is to provide an improved method of preparing amphoterically doped regions in a semiconductor material using a solution regrowth technique.

A further object is to provide a method of the above described type in which a P-N junction is formed in the recrystallized portion of the structure.

The foregoing and other objects, features and advantages of the invention will be apparent from the following more particular description of preferred embodiments of the invention, as illustrated in the accompanying drawings.

Figure 1:
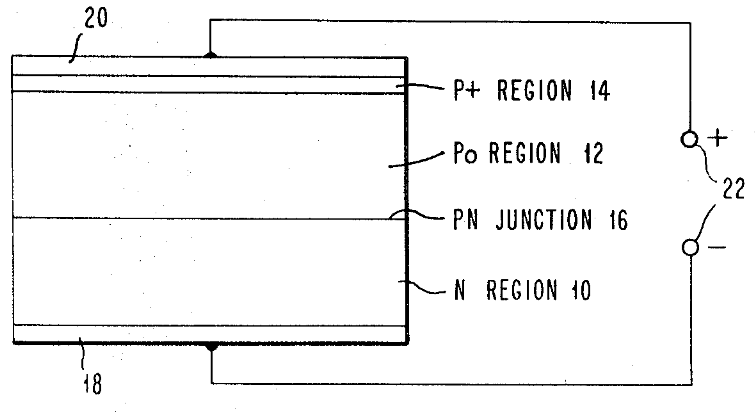
FIGS. 1 and 2 show respectively first and second embodiments of gallium arsenide electroluminescent diodes constructed in accordance with the principles of the present invention.

The light emitting diode shown in FIG. 1 is a three layer semiconductor device formed of a crystal of gallium arsenide which is doped to provide an N region 10, a Po region 12 and a P+ region 14. A P-N junction 16 is formed between N region 10 and Po region 12 and a pair of ohmic contacts 18 and 20 are connected respectively to N region 10 and P+ region 14. These contacts are connected to a pair of terminals 22 to which a voltage is applied with the polarity indicated which forward biases junction 16. When the forward biasing voltage is applied to terminals 22, light is emitted from the diode and more specifically from the entire Po region 12. This light output is in the infrared having a wavelength which corresponds to an energy transition which is appreciably less than the band gap energy for gallium arsenide at the temperature at which the device is operated. Further, the infrared output is produced at an external quantum efficiency, that is photon output actually realized from the device as compared to the number of input electrons, which is significantly greater than that realized in prior art devices having the same optical geometry. More specifically, light outputs at room temperature have been realized which have a wavelength of 9200 Angstroms, the wavelength for the band gap transitions at this temperature being about 9000 Angstroms. These outputs have been produced with external quantum efficiencies over 3.5% with diodes of the type shown in FIG. 1. When the diodes are potted with anti-reflection coatings of suitable epoxy resins, external quantum efficiencies over 6% have been obtained.

The light emitting diode of FIG. 1 is similar to prior art diodes of the type in that the light output is produced as the result of the injection of carriers across a P-N junction into a region where the injected carriers are minority carriers and in this region recombine with carriers of opposite conductivity type to produce recombination radiation. The diode differs structurally from conventional prior art light emitting diodes in that the Po region 12 into which electrons from N region 10 are injected and there recombine with holes is a compensated region which is only slightly P type and the recombination takes place not only adjacent to the junction 16, but throughout the entire region which in the embodiment of FIG. 1 has a thickness of about 50 microns.

Figure 3:
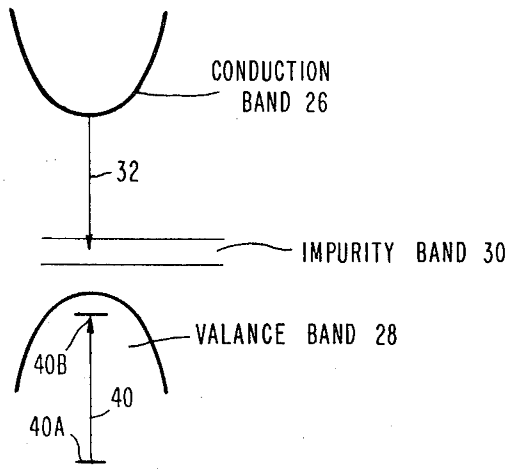
FIG. 3 is a representation of the energy band structure of the active light emitting regions of the devices of FIGS. 1 and 2.

More specifically, when the forward bias is applied across the diode of FIG. 1 by applying a voltage at terminals 22, electrons are injected from the N region 10 across the junction 16 into the Po region 12. Region 12 is a compensated region which is only slightly P type, that is in this region there is only a slight excess of acceptor impurities over donor impurities. Further, the region is so doped that the excess P type acceptor impurities are relatively deep lying impurities and provide an energy band above the valence band. This is indicated in FIG. 3 which is a showing of what is believed to be the energy level structure for the Po region 12. The semiconductor material of the present embodiment is gallium arsenide which is a direct gap material as is indicated by the relative positions of the conduction band 26 and valence band 28 for this material. This P type deep lying impurity level for the material is shown by the band 30 which is located above the edge of the valence band 28. In the region 12 essentially all of the energy states in the valence band are filled with electrons and the P type characteristic of the region results primarily from the acceptor impurities in band 30. The bulk of region 12, for example has over-all impurity concentration greater than $5\times10^{17}$ impurity atoms per cm.$^3$, in some cases as high as $10^{19}$, but the excess of acceptors over donors is in the order of $1\times10^{17}$ or somewhat lower, and the excess hole concentration in the valence based itself is less than $1\times10^{17}$.

Electrons are injected from N region 10 across the junction 16 into the conduction band 26 (FIG. 3) of region 12. The recombination radiation is produced by transitions from conduction band 26 to the deep lying impurity band 30. It is for this reason that the infrared output is at a wavelength longer than that produced by band gap transitions or transitions to shallow lying impurities at levels immediately adjacent to the valence band. Though one might expect that since the region 12 is only slightly P type that the recombination efficiency for the injected electron would be low, this is not the case. Instead as is evidenced by the fact that light is emitted from the entire region 12 which is about 50 microns thick in the embodiment under consideration, the injected electrons diffuse throughout the lightly doped P region and recombine with an over-all efficiency. In order to provide recombination sites for electrons making transitions from conduction band 26, it is necessary to provide holes for this purpose. This is accomplished by providing in a supply of excess holes and in the embodiment of FIG. 1 these holes are injected from the heavily doped P+ region 14.

From the above description it is apparent that the Po region 12 does not have a sufficient concentration of excess holes such that the injected electrons all recombine in the portion of this region immediately adjacent to the junction 16 as is the case in conventional light emitting diodes which are usually doped even to the point of being degenerate. Further, the lifetime of the injected electrons in the environment of region 12 is such that they are able to diffuse across the entire width of this region without undergoing nonradiative type transitions. The internal efficiency for recombination of injected carriers is therefore very high. However, factors other than the internal recombination efficiency affect the over-all external efficiency of the diode and a prime one of these is absorption of the recombination radiation in the body of the light emitting device. This absorption is produced when the photons of light energy are absorbed by electrons which in the absorption process have their energy state changed. This process can only occur according to the principles of quantum mechanics when there is another energy state available for the electron to be pumped into which is separated from the initial energy state of the electron by an energy difference which is equal to the energy of the photon to be absorbed. There are two common types of absorption in devices of the type to which the invention relates. First photons of the light energy can be absorbed by electrons which are thereby moved from the valence to the conduction band. In the device of FIG. 1 having the characteristics of FIG. 3, there are a relatively large number of electrons in the valence band 28 but since as indicated by the arrow 32 the energy of the recombination radiation is less than band gap, absorption cannot take place as the result of electrons being moved from valence to conduction band.

A second type of absorption which has been found to be a serious problem in light emitting diodes is what is termed free carrier absorption. Free carrier absorption is similar to the absorption described above in that the photon energy is absorbed by moving an electron or hole from one energy state to a higher energy state in the material but is different in that the two energy states are in the same band. More specsifically, free carrier absorption can take place in the region 12 of FIG. 3 when an electron which is in a relaitvely low energy state in the valence band is moved to a higher energy state in the valence band. Such a transition is indicated in FIG. 3 by the arrow 40 which matches in energy the photon energy of the recombination radiation indicated by arrow 32. This absorption transition for the electron is depicted between a lower energy state 40A and a higher energy state 40B both of which are in the valence band 28. However, this type of absorption can occur only if there is an available energy state at the level 40B for the electron to occupy, or more specifically, an excess hole at the energy level 40B. However, the region 12 of the device of FIG. 1 is a compensated region which is only slightly P type containing only a relatively small number of excess acceptor impurities. Further, most of the hole energy positions within the valence band are filled with electrons and the excess acceptor impurities are primarily in the rather narrow acceptor impurity band 30. With this type of structure free carrier absorption of the type indicated by arrow 40 is at a minimum and, as a result, the light produced by recombination radiation in region 12 is not highly absorbed in this region. In this respect the device differs significantly from light emitting devices which include a relatively large highly doped P region, for example Zn doped gallium arsenide, which has been found to exhibit a very high coefficient of absorption of recombination radiation. This follows from the fact that where the P region has a high concentration of acceptor impurities, for example $5\times10^{18}$, many of the holes in the upper energy portion of the valence band are unfilled and are therefore available as energy states for free carrier absorption.

Free carrier absorption can also take place in the conduction band in the N type region 10 of the device of FIG. 1. The likelihood of this type of absorption decreases as the density of donor impurities decreases and the N type region 10 of the device of FIG. 1 is prepared to have a relatively low donor impurity concentration.

For the reasons indicated above the highly doped P+ region 14, above $5\times10^{17}$, is highly absorptive of the recombination radiation but this region in the device of FIG. 1 is only 2 microns thick and with the geometry shown much of the light produced in the body is transmitted out of the body without even passing through this region. In this regard reference should be made to the embodiment of FIG. 2 which is identical to that of FIG. 1 with the single exception that the Po region 12 is connected directly to the ohmic contact 20 and there is no P+ region corresponding to the region 14 of FIG. 1. The operation of this device is the same as that of the device of FIG. 2 except that the hole injection necessary to carry the injected electrons after recombination out of the region 12 is directly from the ohmic metal contact 20. Though the elimination of the P+ region 14 in the device of FIG. 2 eliminates the most highly absorbing portion of the device, in the devices thus far produced slightly higher external quantum efficiences have been realized with devices of the type shown in FIG. 1. One possible explanation of this is that the P+ region is more efficient than the ohmic contact in injecting the holes into region 12. It is also possible that in the region 12, having a thickness of 50 microns between junction 16 and P+ region 14, all of the injected electrons do not recombine and those electrons which do not recombine in region 12 do recombine immediately upon entering the highly doped region 14.

The plausibility of this latter explanation is somewhat reinforced by experiments which have been performed that demonstrate that the external efficiency of this device is sharply dependent on the thickness of region 12. From the description thus far of the theory of operation of the invention it follows that best results are obtained when essentially all of the injected electrons recombine to produce radiation in the Po region 12 and at the same time this region is only slightly P type and therefore does not heavily absorb the radiation. Because of the latter requirement there are relatively few holes or vacancies per unit volume in region 12 which are available for recombination with the injected electrons and thus it is necessary to provide a large volume of this material if all injected electrons are to recombine and produced useful output radiation. It is for this reason that the active portion of region 12 is so wide. However, even with this region being 50 microns wide, all of the region 12 is observed to emit radiation and at least some of the injected electrons posibly diffuse across this region to the P+ region 14 of FIG. 1 or the contact 20 of FIG. 2, In the latter case no recombination can take place, but in the former the electrons can immediately recombine in the highly doped P+ region 14 and even though this region heavily absorbs the light, some useful light output is realized.

In experiments conducted to demonstrate the relationship between the external quantum efficiency and thickness of region 12 diodes of the type shown have been constructed with widths both less than and greater than the 50 microns of the preferred embodiment. In the devices having regions which are thinner, for example from 10 microns through 50 microns, the entire regions are observed to emit light but the external quantum efficiency increases markedly as the width of the region 12 is increased. When the width of region 12 is made greater than 50 microns the efficiency is not improved significantly and when the width is made appreciably greater than 50 microns, the infrared output is observed to be emitted only from about 50 to 60 microns portion of the region thereby indicating that the great majority of the injected electrons recombine in this portion of the region.

There is a further reason for not increasing the width of region 12 beyond that which is necessary to realize the desired high external quantum efficiency. Since this region is highly compensated and is only slightly P type, it has a relatively high resistivity and the series resistance of the device increases as region 12 is increased in thickness. It should also be noted that the diodes of the type shown in the embodiment of FIG. 1 have been fabricated with smaller values of series resistance than diodes of the type shown in FIG. 2. The reason for this is that the presently available techniques for making ohmic connections are such that ohmic connections having smaller values of series resistance can be made to the P+ region 14 than to the Po region 12.

Figure 2:
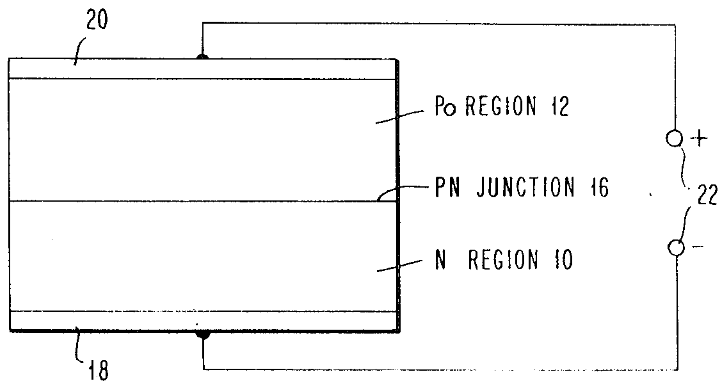

The description of the invention thus far has been directed primarily to the structure and characteristics of the light emitting devices which are the subject of the present invention. In practice it has been found that this novel structure exhibiting these improved characteristics can best be fabricated by preparing the N region 10 and Po region 12 and the junction 16 between these regions using a dopant which is amphoteric in the crystalline substrate from which the light emitting devices are prepared. An amphoteric dopant is one which can be caused to enter the crystalline lattice of the substrate crystal in different ways so that it can be either an acceptor impurity or a donor impurity. In the devices of FIGS. 1 and 2, the substrate is a gallium arsenide crystal and the amphoteric dopant used is silicon. Silicon is ordinarily a donor or N type impurity in gallium arsenide but by properly controlling the manner in which the silicon is placed within the gallium arsenide substrate, it can be entered as a P type or acceptor impurity. In the devices of FIGS. 1 and 2 the primary dopant on both sides of the junction 16 is silicon. In the N region 10 the silicon is predominantly a donor impurity. In the compensated Po region the silicon is entered as both an acceptor and a donor impurity with a small excess of the silicon atoms present occupying acceptor sites to impart to this region its Po type characteristic. The $P^+$ region 14 of the device of FIG. 1 is highly doped with the impurity Zn which is an acceptor impurity in gallium arsenide.

It has also been discovered that devices of the type to which this invention relates can best be fabricated using solution regrowth techniques. A description of solution regrowth and apparatus for carrying out this type of process is found in an article by H. Nelson which appeared in the RCA Review, vol. 24, p. 603, 1963. In this method a semiconductor substrate containing one type of impurity is placed in contact with a melt which contains both an impurity and the material of the substrate. The temperature is controlled so that initially the surface of the substrate is itself dissolved until an equilibrium condition is realized.

Then as the melt cools recrystallization takes place epitaxially on the exposed physical boundary of the substrate. In conventional processes of this type the original substrate is prepared to be of one conductivity type and the melt includes an impurity of opposite conductivity type and P-N junction is formed at the physical boundary of the substrate, that is the exposed surface which is not dissolved. In embodiments of the present invention disclosed herein as examples of the best mode of practicing the invention, the devices have been prepared by solution regrowth using gallium arsenide as the substrate and silicon as an amphoteric dopant. Further in the process as carried out the junction 16 itself between the N and Po regions 10 and 12 is formed in the recrystallized portion of the structure rather than at the physical boundary.

More specifically typical devices are prepared using as a substrate a crystal of gallium arsenide doped with silicon which is N type and has a concentration less than $5\times10^{17}$ electron per $cm.^3$. The melt typically consists of a mixture of 9 grams of Ga, 1.5 grams of GaAs and 30 mg. of silicon. It should be noted that the melt is rich in gallium, that is it contains more gallium relative to the arsenic present than in the stoichiometric composition of the compound gallium arsenide. The reason for this is that silicon enters gallium arsenide primarily as an N type impurity on Ga sites when the melt is close to a stoichiometric composition. When the arsenic pressure is reduced, such as here where the growth is from a gallium rich melt, silicon is primarily incorporated as an acceptor on arsenic sites. The processes have been found to be rather critically dependent on temperature.

The gallium rich mixture and the N type gallium arsenide substrate are initially heated individually in a furnace and are brought together in the presence of a forming gas such as hydrogen at a temperature of 935° C. The main face of the substrate which is brought into contact with the melt corresponds to a (100) plane of the gallium arsenide. Once brought into contact the temperature is then reduced at a rate of 1° C. per min. When brought into contact as pointed out above a portion of the gallium arsenide substrate is dissolved and thereafter as the temperature is lowered regrowth takes place. The silicon in the melt enters as an impurity into the regrown crystal, and the temperature is rather critically important in determining whether the amounts of silicon which enter as P type and N type impurities.

In the process here described the initially grown layer is found to be a compensated layer which is N type. After regrowth of a layer of 20 to 30 microns, the conductivity changes to compensated P type. As the temperature is decreased, more of the silicon enters as an acceptor impurity. Though the entire Po region is only slightly P type and is compensated, the excess of silicon acceptor impurities increases as the successive layers are grown at decreasing temperatures. The temperature is decreased to a temperature of about 750° at which time the crystal containing the junction in the regrown portion of the crystal is removed. At this time the regrown region is lapped down to obtain the Po region 12 having the width of about 50 to 60 microns. Zinc is then diffused into the surface of the region at a temperature of about 650° C. for about 20 minutes to provide the $P^+$ region 14 of FIG. 1, which is about 2 microns in thickness. Ohmic contacts 18 and 20 are then made on the opposite surface of the device. In preparing the devices of the type shown in FIG. 2, the zinc diffusion step is eliminated and the ohmic contact 20 is placed directly on the Po region 12.

It has been found that both the temperature maintained during the regrowth process and the rate of cooling critically determine the conductivity characteristics of the regrown crystal. The critical temperature range is from 920° C. to 890° C. if a compensated region which is slightly P type is to be realized. Thus, if the regrowth temperature is maintained above for example 935° C. a very large fraction of the region is N type. If the process is carried out at a lower temperature, for example 750° C., the regrown layer is highly P type and the width of the light emitting region in the resulting diode is markedly reduced. Further, in this type of device the absorption loss in the P material is relatively high. Though in the process described above the initial temperature for the regrowth process is 935° C. at which the silicon enters predominantly as a donor impurity and the junction is formed in the regrown portion of the material, the practice of the invention as it relates to the fabrication devices of this type shown in FIGS. 1 and 2 is not so limited. The starting temperature may be below this value and the original regrowth can be of highly compensated or P type material as long as growth to be desired width for the active region is produced in the range from 920° C. to 890° C.

It is, of course, understood that the solution regrowth method as described above can be practiced with other materials than GaAs and silicon. For example, other impurities such as germanium and tin are amphoteric in gallium arsenide and other substrate crystals which also can be amphoterically doped may be used.

In summarizing the invention embodied in the specific structures and method described above, it should be pointed out that the improved electroluminescent device is realized by employing as an active region in the device a volume of semiconductor material which is compensated but is sufficiently P type to provide sites for the electron recombination process. At the same time a relatively low concentration of these recombination sites are provided so that recombination takes place throughout a relatively large volume of the material. The recombination sites are chosen to be deep lying impurities so that the recombination radiation is at an energy significantly less than the band gap energy thereby minimizing the possibility of absorption by band to band transition. The valence band is essentially filled thereby minimizing the possibility of absorption by free carrier transitions. Active regions having these characteristics have been successfully prepared using an amphoteric dopant, and in these structures a P-N junction has been used to inject the electrons into the active light emitting region. Devices of this type have been fabricated using a novel solution regrowth process in which an amphoteric impurity is controlled to enter the recrystallized semiconductor in the required proportions of P and N type by controlling the temperatures at which the recrystallization takes place. In the preferred method used to prepare the devices disclosed herein, the substrate material is gallium arsenide, the amphoteric dopant is silicon, and the solution regrowth process is carried out to form the junction in the regrown portion of the crystal.

Finally, it should be pointed out that the actual preferred thickness or width of the active region, the Po compensated region 12 of FIGS. 1 and 2, may depend on the application. It has been found, for example, that the width of the actual light emitting region is temperature dependent. Thus, the device prepared as described above with an active region of about 50 to 60 microns is observed to emit light essentially over the entire region at room temperature for a given input current. For the same input current at 300° K. the light is emitted from a portion of this region about 40 microns wide and at 77° K. the width of the active portion is about 15 microns. The width of the portion of the active region which actually emits light is also dependent upon the number of electrons injected and therefore on the amount of current which passes through the device. This dependence follows from the fact that since the active region is only slightly P type, if recombination efficiency is to be maintained at a high value, larger volumes of the material are required as the number of injected electrons is increased.

While the invention has been particularly shown and described with reference to preferred embodiments thereof, it will be understood by those skilled in the art that various changes in form and details may be made therein without departing from the spirit and scope of the invention.

What is claimed is:

1. A method of forming light emitting devices comprising the steps of:
(a) heating a mixture containing gallium, arsenic and silicon to form a melt;
(b) contacting a gallium arsenide crystal substrate including silicon entered as a donor impurity so that the crystal substrate is N type with said melt at a first temperature at which at least a portion of said substrate dissolves in said melt;
(c) and cooling said melt to recrystallize gallium arsenide doped with silicon from said melt on said substrate through temperatures in the range from 920° to 890° C.

2. The method of claim 1 wherein in said melt mixture containing gallium, arsenic and silicon, the percentage of gallium relative to the percentage of arsenic in said mixture is higher than in the stoichiometric composition of the compound gallium arsenide.

3. The method of claim 1 wherein said melt mixture includes gallium arsenide, silicon and gallium.

4. The method of claim 1 wherein said melt is contacted with said substrate at a temperature above 920° C. and is then cooled through the temperature range from 920° C. to 890° C.

5. The method of claim 4 wherein said melt is contacted with said substrate at a first temperature of about 935° C. and is then cooled through said temperature range from 920° C. to 890° C.

6. The method of claim 5 wherein said melt is brought into contact with said substrate at said temperature 935° C. and is then cooled at a rate of about 1° C. per minute through the temperature range 920° C. to 890° C.

7. A solution regrowth method of forming semiconductor crystals with P-N junctions comprising the steps of:
(a) heating a mixture of semiconductor material and an amphoteric impurity for the semiconductor material to form a melt;
(b) contacting a crystal substrate of said semiconductor material which includes said amphoteric impurity predominantly as an impurity of a first conductivity type with said melt at a first temperature at which at least a portion of said crystal dissolves in said melt;
(c) cooling said melt while in contact with said crystal substrate at one or more temperatures in a first temperature range at which said melt recrystallizes on said crystal substrate and said amphoteric impurity in the melt enters the recrystallized body as an impurity of a conductivity type opposite said first conductivity type.

8. The solution regrowth method of claim 7 wherein said temperature at which said melt and crystal are contacted is above said first temperature range and including the step of first cooling said melt through a temperature range at which said melt recrystallizes on said crystal substrate with said amphoteric impurity in the melt entering the crystallized body predominantly as an impurity of said first conductivity type, whereby the P-N junction is formed in the recrystallized portion of the crystal.

9. The method of claim 7 wherein said semiconductor crystal is gallium arsenide, said impurities of a first conductivity type are donors and of an opposite conductivity type are acceptors, said amphoteric impurity is silicon, and said first temperature range is from 890° C. to 920° C.

10. The method of claim 9 wherein said first temperature is above 920° and said method includes the steps of first cooling said melt from said first temperature through a temperature range at which the silicon enters the recrystallized body predominantly as a donor and then cooling the melt through at least a portion of said range from 920° C. to 890° C. at which the silicon enters the recrystallized body predominantly as an acceptor.

11. A solution regrowth method of forming light emitting devices including a wide light emitting region in a crystal body of semiconductor material comprising the steps of:
(a) first contacting at an elevated temperature a crystal substrate doped with an amphoteric impurity which in the substrate predominantly first conductivity type with a melt containing the material of the substrate and the dopant;
(b) cooling said melt in contact with said substrate to form said light emitting region by recrystallization from said melt on said substrate, said cooling being carried out through a temperature range at which the majority of atoms of said amphoteric impurity which enter the recrystallized region as impurities of a conductivity type opposite said first conductivity type are compensated by atoms of said amphoteric impurity which enter said region as impurities of said first conductivity type, and a small excess of atoms enter said region as impurities of said opposite conductivity type.

12. The method of claim 11 wherein said impurities of said first conductivity type are donors and of opposite conductivity type are acceptors, said semiconductor material is gallium arsenide and said amphoteric dopant is silicon.

13. The method of claim 11 wherein said cooling is carried out from a temperature above 920° C. to or below a temperature in a range from 920° C. to 890° C.

References Cited

H. Nelson, "Epitaxial Growth From the Liquid State and Its Application to the Fabrication of Tunnel and Laser Diodes," in RCA Review, December 1963, pp. 603–615.

L. DEWAYNE RUTLEDGE, Primary Examiner

E. L. WEISE, Assistant Examiner

U.S. Cl. X.R.

148—172; 313—108